United States Patent
Sivasubramaniam et al.

(10) Patent No.: US 10,630,244 B2
(45) Date of Patent: Apr. 21, 2020

(54) PULSE WIDTH DISTORTION CANCELLATION OF A SWITCHING MODE AMPLIFIER FOR REDUCED SECOND HARMONIC INTERFERENCE

(71) Applicant: SHENZHEN GOODIX TECHNOLOGY CO., LTD., Shenzhen (CN)

(72) Inventors: Janakan Sivasubramaniam, San Diego, CA (US); Rami Khatib, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/922,934

(22) Filed: Mar. 16, 2018

(65) Prior Publication Data
US 2019/0288647 A1    Sep. 19, 2019

(51) Int. Cl.
*H03F 1/26* (2006.01)
*H03F 3/19* (2006.01)
*H03F 3/21* (2006.01)
*H03F 3/45* (2006.01)
*H03F 1/32* (2006.01)
*H03F 1/02* (2006.01)
*H03F 3/217* (2006.01)

(52) U.S. Cl.
CPC ............. *H03F 1/26* (2013.01); *H03F 1/0266* (2013.01); *H03F 1/0272* (2013.01); *H03F 1/3205* (2013.01); *H03F 3/19* (2013.01); *H03F 3/21* (2013.01); *H03F 3/2171* (2013.01); *H03F 3/45475* (2013.01); *H03F 2200/171* (2013.01); *H03F 2200/372* (2013.01); *H03F 2200/387* (2013.01); *H03F 2200/451* (2013.01); *H03F 2203/45116* (2013.01)

(58) Field of Classification Search
USPC ............... 330/10, 251, 207 A, 311, 285, 296
See application file for complete search history.

(56) References Cited

U.S. PATENT DOCUMENTS

| | | | |
|---|---|---|---|
| 6,784,740 B1 | 8/2004 | Tabatabaei | |
| 8,410,772 B1 | 4/2013 | Potluri | |
| 8,446,173 B1 | 5/2013 | Faucher et al. | |
| 8,829,945 B2 * | 9/2014 | Santos | H03F 3/217 327/108 |
| 9,407,209 B2 * | 8/2016 | Ba | H03F 1/0233 |
| 2007/0273440 A1 | 11/2007 | Wendt et al. | |
| 2010/0194476 A1 | 8/2010 | Drogi et al. | |
| 2015/0162882 A1 | 6/2015 | Tam et al. | |

OTHER PUBLICATIONS

European Search Report dated Jul. 22, 2019 in the corresponding EP application (application No. 18792836.1).

* cited by examiner

*Primary Examiner* — Hieu P Nguyen
(74) *Attorney, Agent, or Firm* — Kilpatrick Townsend & Stockton LLP (57) ABSTRACT

A switching-mode power amplifier includes a driver circuit having an input for receiving a radio frequency (RF) signal, an output for outputting a digital output signal, and a bias port for receiving a bias signal, and a bias circuit having a first input coupled to the output of the driver circuit for receiving the digital output signal, a second input coupled to the input of the driver circuit for receiving the RF signal, and an output coupled to the bias port of the driver circuit for providing the bias signal to the driver circuit.

18 Claims, 9 Drawing Sheets

PULSE WIDTH DISTORTION CANCELLATION OF A SWITCHING MODE AMPLIFIER FOR REDUCED SECOND HARMONIC INTERFERENCE

TECHNICAL FIELD

The invention relates to switching mode power amplifiers that resemble in many aspects to operations and architectures of class-D power amplifiers.

BACKGROUND OF THE INVENTION

There are a variety of power amplifiers that can be classified into two groups: classical, non-switching amplifiers such as class A, class B, class AB, class C, and switching-mode amplifiers such as class D, class E, and class F. A non-switching amplifier has its active elements operating in the linear region for a specific predetermined conduction angle and generates an amplified output signal that is proportional to the input signal or a portion of the input signal. Non-switching amplifiers have a relatively low power-added efficiency (PAE) since a relatively large portion of the conduction angle is in the linear region of the transistor resulting in power dissipation, whereas switching amplifiers can achieve theoretical efficiency of 100%. Since portable and wearable electronic devices have gained popularity, the demand for smaller, lighter, and more power efficient electronic devices has also increased. The fast transition (square wave) needed to reduce transistor power dissipation in switching-mode amplifiers also results in high frequency content present in the harmonics of the signal. The harmonics may exceed out-of-band spurious emission limits set by standard regulatory agencies, such as the U.S. Federal Communications Commission (FCC) or ETSI.

Figure 1A:
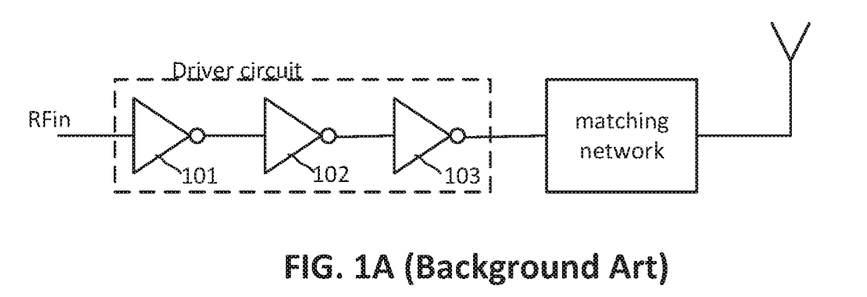
FIG. 1A is a block diagram of an ideal class-D amplifier that can be used for the description of the present invention.
Figure 1B:
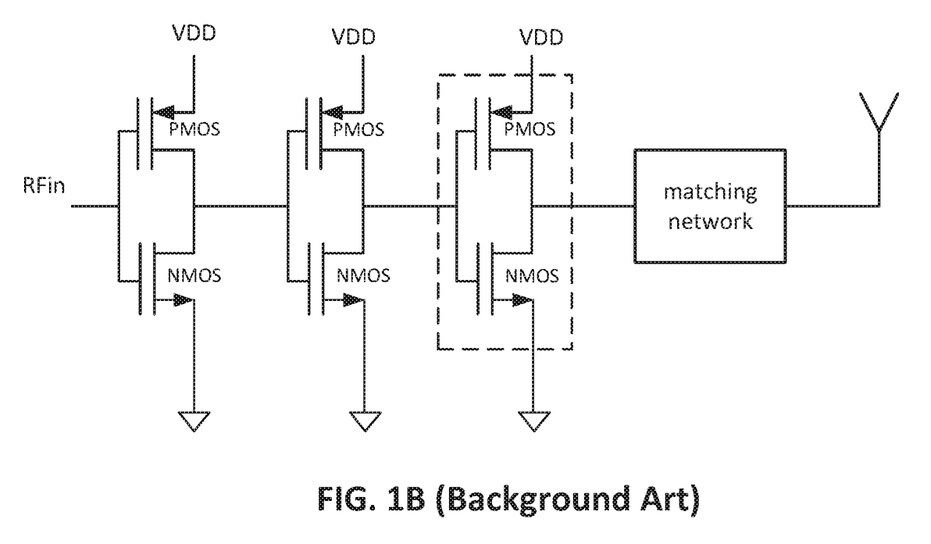
FIG. 1B is a functionally equivalent circuit of FIG. 1A.

FIG. 1A is a block diagram of an ideal class-D amplifier 100. Class-D amplifier includes a cascade-connected inverting amplifier stages 101, 102, and 103. The radio frequency (RF) input signal RFin is a square wave having a duty cycle of 50%. A duty cycle of 50% is referred to a square waveform having the voltage high ("1") during half of each cycle and the voltage low ("0") during the rest of the duty cycle. FIG. 1B is a functionally equivalent circuit of FIG. 1A. Each inverting amplifier stage includes a p-channel metal oxide semiconductor (PMOS) device and an n-channel metal oxide semiconductor (NMOS) device connected in series between a power supply VDD and ground. Ideal class-D amplifier 100 operates by switching between fully-on and fully-off. When in the fully-on mode, the current through the power transistor is at a maximum, but the voltage is at a minimum, so that the power dissipation is minimal. When in the fully-off mode, the voltage across the power transistor is at a maximum, but the current is at a minimum, so that the power dissipation is also minimal.

Figure 1C:
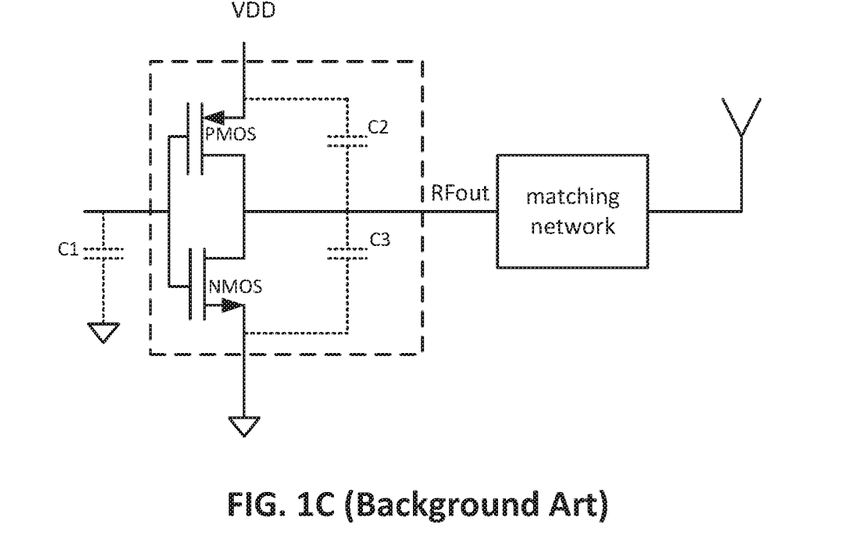
FIG. 1C is a circuit diagram illustrating parasitic capacitances in an inverting amplifier stage.

FIG. 1C is a circuit diagram illustrating parasitic capacitance in an inverting amplifier stage. Referring to FIG. 1C, the inverting amplifier stage has an input parasitic capacitance C1 between the gate and ground (comprised of the PFET gate to drain, PFET gate to source, and NFET gate to drain, and NFET gate to source, capacitances), a parasitic capacitance C2 between the source and drain of the PMOS transistor, and a parasitic capacitance C3 between the drain and source of the NMOS transistor. In operation, the inverting amplifier stage generates an output signal RFout and applies the RFout signal to an antenna for transmission. Because the parasitic capacitance C1, C2, and C3 are charged as a result of the input signal and as a result of the one of the PMOS or NMOS being "on", the parasitic capacitances cause delay in the rise and fall time of the signal. Since the delay in the rise time may not equal the delay in the fall time, pulse width distortion can occur, and is likely to occur in any practical design, particularly over process and temperature.

Figure 1D:
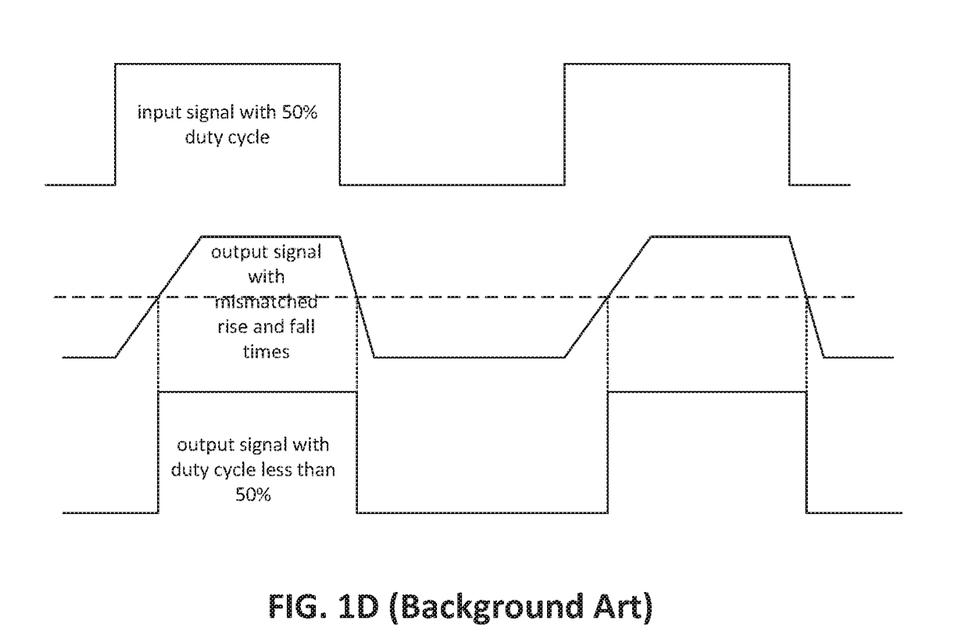
FIG. 1D is a graph illustrating rise and fall times of signals traversing across an inverting amplifier stage.

FIG. 1D is a graph illustrating rise and fall times of signals traversing across an inverting amplifier stage. As shown in FIG. 1D, due to the charging and discharging of the parasitic capacitances, signals at the output of an inverting amplifier stage have slow rising and falling edges that consume relatively large power during the slow transition when both transistors are conducting. Because the electron mobility between the PMOS and NMOS transistors are different, the rise and fall times of the edges may mismatch. The mismatch of the rise and fall times of the edges cause a distortion in the duty cycle that causes even-order harmonics that are normally not present to appear. The second harmonic is the most problematic of the even-order harmonics and is often singled out for emphasis.

Figure 2A:
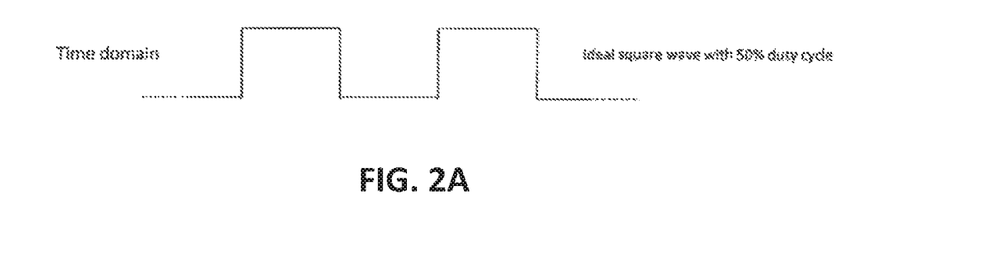
FIG. 2A is a graph illustrating an ideal square wave with 50% duty cycle for explaining embodiments of the present invention.
Figure 2B:
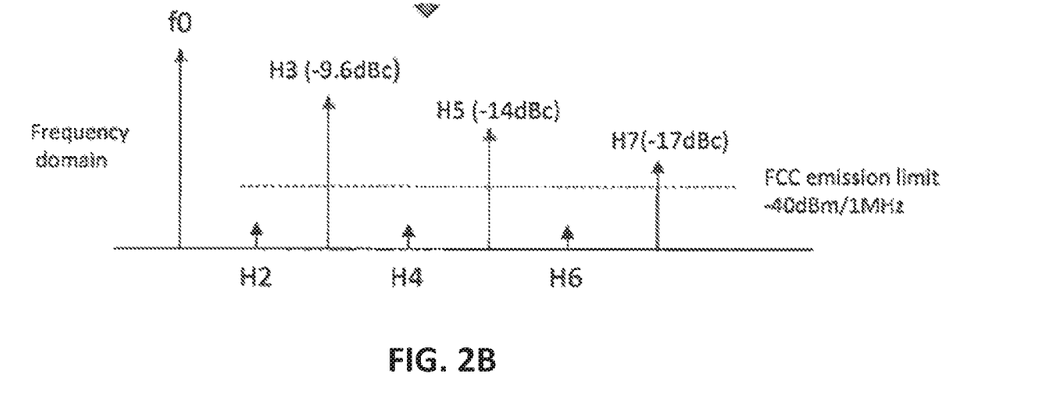
FIG. 2B is a graph illustrating the harmonics produced by the ideal square wave with 50% duty cycle.
Figure 2C:
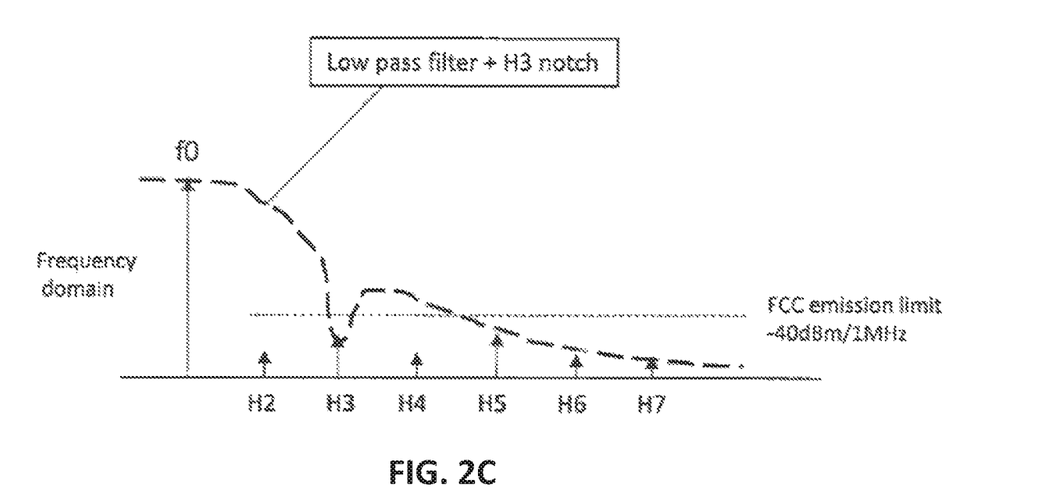
FIG. 2C is graph illustrating the harmonics passing through a low-pass filter with a notch filter tuned to the third harmonic frequency.

FIG. 2A is a graph illustrating an ideal square wave with 50% duty cycle. FIG. 2B is a graph illustrating the harmonics produced by the ideal square wave with 50% duty cycle. As shown in FIG. 2B, the odd harmonics, i.e., third harmonic H3, fifth harmonic H5 and seventh harmonic H7 exceed the FCC emission limit. One way of solving the harmonics emission problem is to add a low-pass filter and a band-stop (notch) filter at the output of the amplifier to filter out any unwanted harmonics. FIG. 2C is graph illustrating the harmonics passing through a low-pass filter with a notch (band-pass filter) at the third harmonic H3 to satisfy the FCC emission limits.

Figure 3A:
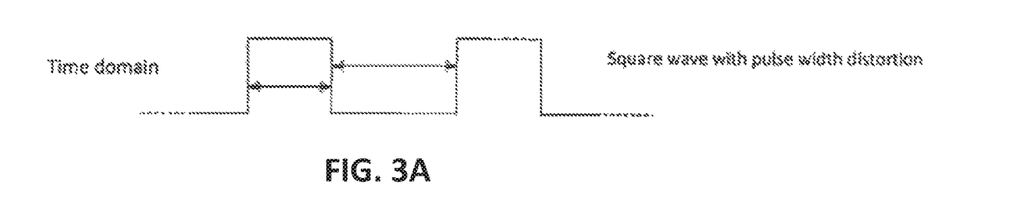
FIG. 3A a graph illustrating a square wave with pulse width distortion, i.e., the duty cycle is other than 50%.
Figure 3B:
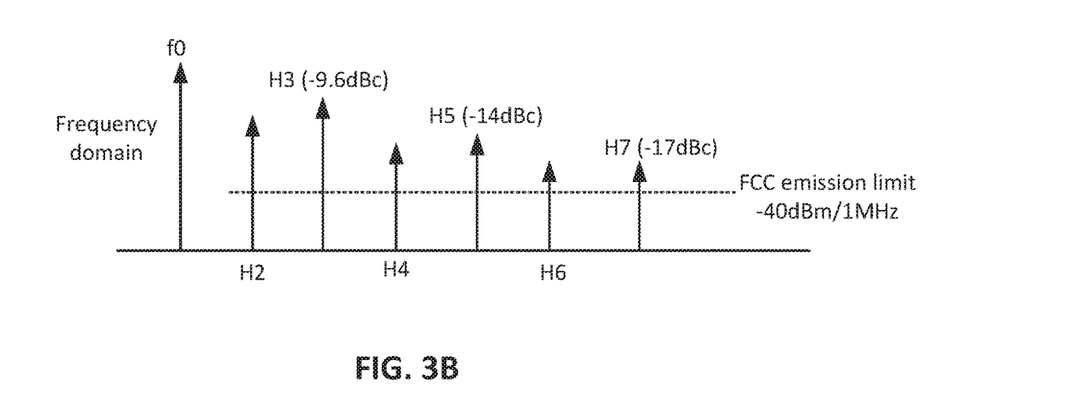
FIG. 3B is a graph illustrating harmonics produced by the square wave with a duty cycle other than 50%, while the fundamental frequency remains unchanged.
Figure 3C:
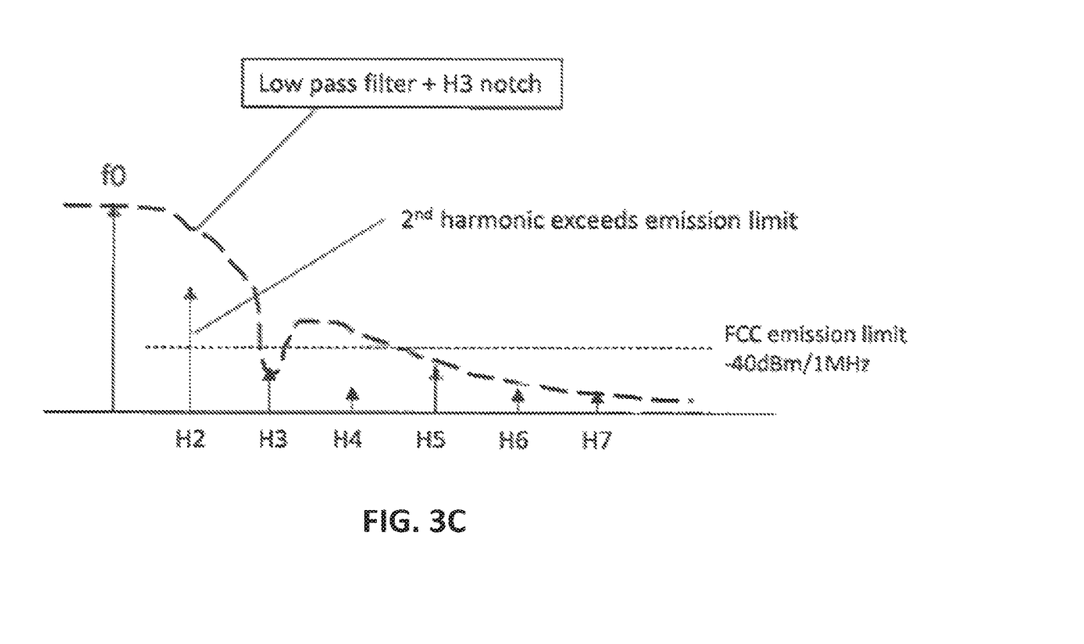
FIG. 3C is a graph illustrating the harmonics passing through a low-pass filter with a notch filter tuned to the third harmonic.

FIG. 3A a graph illustrating a square wave with pulse width distortion, i.e., the duty cycle is other than 50%. Please note that the drawings are not necessarily drawn to scale and the numerical values provided herein are for explanation purposes. Referring to FIG. 3A, output signals may be 40% (in praxis more close to 48%) of the time and 0V 60% (in praxis more close to 52%) of the time. FIG. 3B is a graph illustrating the harmonics produced by the square wave with a duty cycle other than 50%, while the fundamental frequency remains unchanged. As shown in FIG. 3B, a duty cycle other than 50% will produce even-order harmonics H2 that exceed the FCC emission limit. As shown in FIG. 3C, it is the $2^{nd}$ harmonic that is most problematic due to its close proximity to the fundamental. One way to reduce the second harmonic is to add an extra band-stop (notch) filter at the output of the amplifier targeting the $2^{nd}$ Harmonic. Such complicated filters are normally not feasible to be integrated with the amplifier in a same integrated circuit. Further, such filter, whether on or off chip, will introduces power loss to the fundamental frequency. FIG. 3C is graph illustrating the harmonics passing through a low-pass filter with a notch filter tuned to the third harmonic H3. As shown in FIG. 3C, higher-order harmonics (e.g., H4, H5, H6, etc.) are well attenuated by the low-pass filer, but the second harmonic is relatively close to the fundamental frequency, so that adding a notch at H2 may also affect the frequency response of the fundamental frequency, i.e., the notch filter targeting the second harmonic H2 may exhibit some attenuation at the fundamental frequency and adversely degrade the output power and efficiency.

For class-D amplifiers used for audio applications, the audio signal is modulated onto the high frequency square wave by pulse-width modulation. After efficient amplification of the pulse-width modulated square wave at the fundamental switching frequency, the fundamental switching frequency as well as all harmonics of the switching frequency can be easily removed through a low-pass filter, leaving the audio signal of interest. Since the switching frequency and harmonics are very far from the audio frequency, a low-pass filter is sufficient. Additional notches targeting specifics harmonics is not needed in the audio application. In the case of the proposed RF class-d amplifier, the fundamental switching frequency is the frequency of interest (to be amplified and transmitted via the antenna). The desired information is modulated by phase or frequency modulation which preserves the ideal 50% duty cycle (the switching frequency is not pulse-width modulated, but rather phase or frequency modulated). Therefore the filtering requirements are quite different, since only the harmonics of the fundamental must be removed, but not the fundamental switching frequency itself. Unfortunately, such a low-pass filter cannot be realized at a reasonable cost in radio frequency (RF) applications due to the required high Q-factor. Off-chip SAW or BAW filters add cost and significant loss of 1 dB or more.

Therefore, there is a need to control the rise and fall times at the output signals of a (frequency or phase modulated) class-D amplifier to prevent the square wave from deviating from the 50% duty cycle that is the source of the second harmonic.

BRIEF SUMMARY OF THE INVENTION

Embodiments of the present disclosure provide a circuit, a device, and a method that can reduce harmonics in a switch-mode power amplifier.

In accordance with an embodiment of the present disclosure, a class-D power amplifier includes a driver circuit having an input for receiving a radio frequency (RF) signal, an output for outputting a digital output signal, and a bias port for receiving a bias signal, and a bias circuit having a first input coupled to the output of the driver circuit for receiving the digital output signal, a second input coupled to the input of the driver circuit for receiving the RF signal, and an output coupled to the bias port of the driver circuit for providing the bias signal to the driver circuit.

In one embodiment, the RF signal is a square wave having a 50% duty cycle.

In one embodiment, the bias circuit further includes a first averaging circuit configured to determine a first average voltage value of the digital output signal, a second averaging circuit configured to determine a second average voltage value of the RF signal, and a comparator configured to generate a bias voltage signal based on a difference between the first average voltage value and the second average voltage value.

In one embodiment, the comparator is a differential operation amplifier having a first input for receiving the digital output signal, a second input for receiving the RF signal, and an output for outputting the bias voltage signal.

In one embodiment, the first averaging circuit includes a first operational amplifier having a plurality of inputs coupled to the digital output signal and configured to sum a voltage or a current associated with a carrier signal subset of the digital output signal, and the second averaging circuit comprises a second operational amplifier having a plurality of inputs coupled to the RF signal and configured to sum a voltage or a current associated with a carrier signal subset of the RF signal.

In one embodiment, the driver circuit further includes a first transistor having a gate coupled to the RF signal, a second transistor having a gate coupled to the RF signal, a first cascode transistor disposed between the first transistor and the output of the driver circuit and having a gate coupled to the bias signal, and a second cascode transistor disposed between the output of the driver circuit and the second transistor and having a gate coupled to the bias signal. The first transistor, the second transistor, the first cascode transistor, and the second cascode transistor are connected in series between a power supply voltage and ground.

In one embodiment, the first transistor is a PMOS transistor, the first cascode transistor is a PMOS transistor, the second transistor is an NMOS transistor, and the second cascode transistor is an NMOS transistor.

In one embodiment, the first cascode transistor and the second cascode transistor balance a rise time and a fall time of the digital output signal to obtain a 50% duty cycle of the digital output signal.

In one embodiment, the class-D power amplifier further includes a first path having a first plurality of inverters disposed between the RF signal and the gate of the first transistor, and a second path having a second plurality of inverters disposed between the RF signal and the gate of the second transistor.

In one embodiment, the first plurality of inverters include a first pair of inverters connected in series, and the second plurality of inverters include a second pair of inverters connected in series.

Embodiments of the present invention also provide a method for balancing rise and fall times of a digital output signal. The method may include receiving a radio frequency (RF) signal by a driver circuit, generating the digital output signal by the driver circuit, determining a first average voltage value associated with the received RF signal by a bias circuit, determining a second average voltage value associated with the digital output signal, generating a bias voltage signal by comparing the first average voltage value with the second average voltage value, and balancing the rise and fall times of the digital output signal in response to the bias voltage signal to obtain a 50% duty cycle of the digital output signal.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It should be understood that each specific numerical value provided herein is to be construed as merely illustrative and not as a limitation. Accordingly, other examples of exemplary embodiments may have different values.

Figure 4:
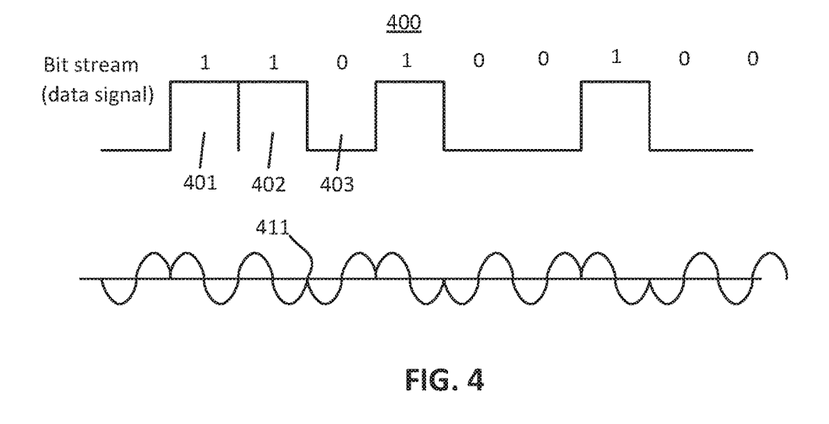
FIG. 4 is a graphical representation of data bit stream and data encoding of a Phase Shift Keying (PSK) waveform that can be used for explaining embodiments of the present invention.

FIG. 4 illustrates a basic form of binary phase shift keying (BPSK) waveform signal for modulating a carrier signal. Referring to FIG. 4, an input data signal includes a bit stream, e.g., a first binary "1" is transmitted in time slot 401, a second binary "1" is transmitted in time slot 402, a binary "0" is transmitted in time slot 403, and so forth. In a PSK modulation process, the transmitted information is contained in the phase of the transmitted signal. Between time slots 402 and 403, the data changes from a "1" to a "0". The data transition is shown in the 180° phase reversal at time 411. It is understood that the BPSK is shown for describing embodiments of the present invention and should not be limiting. A variety of PSK schemes are commonly used to transmit information in communication systems, for example, DPSK, QPSK, DQPSK, 8DPSK, etc. Other modulation schemes such as frequency shift keying (FSK), GFSK, and the like may also be used. The phase information (PSK) or frequency information (FSK) of the data signal (bit stream) may be provided to a digital modulator (not shown herein for simplicity) operating at a frequency several times (e.g., the local oscillator frequency) the frequency of the bit stream. Hereinafter, the modulated carrier signal is referred to as "RF data" or RF data (without the quote mark " ") that is a square wave signal.

Figure 5:
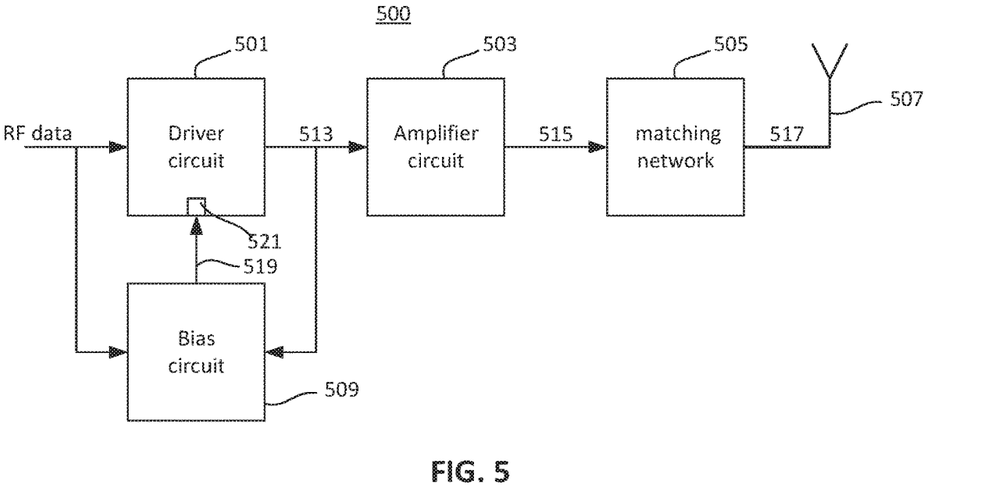
FIG. 5 is a simplified block diagram of a power amplifier circuit 500 according to an embodiment of the present invention.

FIG. 5 is a simplified block diagram of a power amplifier circuit 500 according to an embodiment of the present invention. Referring to FIG. 5, the power amplifier circuit 500 includes a driver circuit 501, an amplifier circuit 503, a matching network 505, and an antenna 507 coupled to an output of matching network 505. Power amplifier circuit 500 also includes a bias circuit 509. Driver circuit 501 is configured to receive a modulated carrier signal "RF data" (e.g., a local oscillator signal modulated with the phase or frequency information of a data signal) and provides a rail-to-rail digital output signal 513. Amplifier circuit 503 receives signal 513 and output an amplified output signal 515 to matching network 505. In some embodiments, amplifier circuit 503 may be omitted if driver circuit generates sufficient output power to directly drive antenna 507. In one embodiment, matching network 505 may be a low-pass filter that passes through the fundamental frequency of signal 515 (or 513 if amplifier circuit 503 is omitted) to antenna 507 for transmission. In one embodiment, matching network 505 may include an inductor and a capacitor that are tuned to the fundamental frequency and configured to match the impedance (e.g., 50Ω) of antenna 507. Bias circuit 509 is configured to determine pulse-width distortion (i.e., duty cycle other than 50%) of output signal 513 and generate a bias signal 519 to reduce or eliminate the pulse-width distortion of output signal 513.

Figure 6:
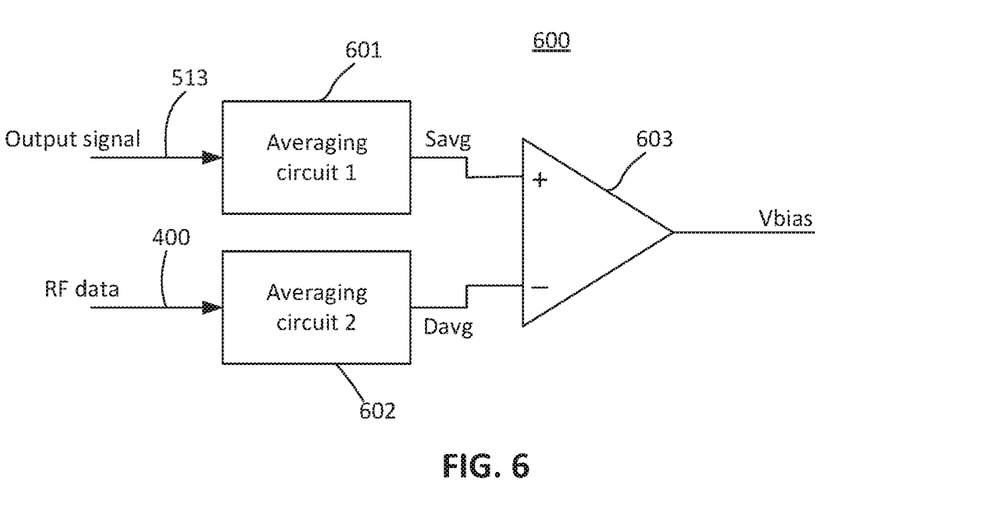
FIG. 6 is a simplified circuit diagram of a bias circuit according to an embodiment of the present invention.

FIG. 6 is a simplified circuit diagram of a bias circuit 600 according to an embodiment of the present invention. Referring to FIG. 6, bias circuit 600 includes a first averaging circuit 601 configured to determine an average voltage value of a received signal (e.g., output signal 513 shown in FIG. 5) and outputs an average signal Savg, a second averaging circuit 602 configured to determine an average voltage value of a received signal RF out and outputs an average signal Davg, a differential operational amplifier 603 operative as a comparator to compare the average signal Savg with the average signal Davg and output a difference signal Vbias. The average signal Davg may be used as a reference signal Vref. In one embodiment, differential operational amplifier 603 has a positive input terminal for receiving the signal Savg, a negative input terminal for receiving the signal Davg (i.e., Vref), and an output terminal for outputting the difference signal Vbias. The signal Vbias is provided to driver stage circuit 501 for adjusting (balancing) the rise and fall times of the edges of output signal 513. The difference signal Vbias is positive when the signal value of Savg is greater than the signal value of Davg (Savg>Davg), i.e., the fall time>the rise time; the Vbias is negative when the signal value of Savg is lower than the signal value of Davg (Savg<Davg), i.e., the fall time<the rise time. Vbias is zero when the signal value of Savg is equal to the signal value of Davg (Savg=Davg), i.e., the fall time=the rise time.

Figure 6A:
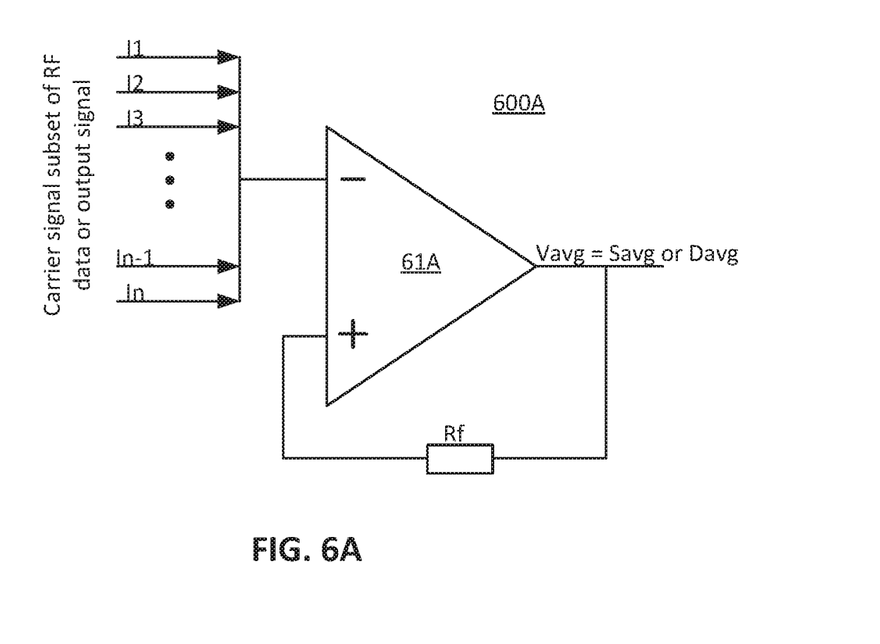
FIG. 6A is an exemplary averaging circuit according to an embodiment of the present invention.

FIG. 6A is an exemplary averaging circuit 600A according to an embodiment of the present invention. Averaging circuit 600A includes an operational amplifier 61A having a negative input terminal, a positive input terminal, and an output terminal coupled to the positive input terminal through a feedback resistor Rf. Currents I1, I2, . . . , In−1, and In of a corresponding carrier signal subset (cycle1, cycle2, . . . , cyclen) of the output signal 513 (or "RF data") are coupled to the negative input terminal of the operational amplifier. Herein, cycle1, cycle2, cyclen are a subset of square wave signals taken from the modulated carrier signal "RF data". As is well known, the output Savg (or Davg) of averaging circuit 600A with a feedback operational amplifier is obtained by applying Kirchhoff's first law to the input terminal of the operational amplifier according to the following relation:

Vavg=−Rf(I1+I2+ . . . +In), where I1, I2, . . . , In are currents of corresponding bits of the bit stream subset of the output signal (or RF data). Vavg is the Savg if the carrier signal subset is of the output signal 513. Vavg is the Davd if the carrier signal subset is of the RF data.

Figure 6B:
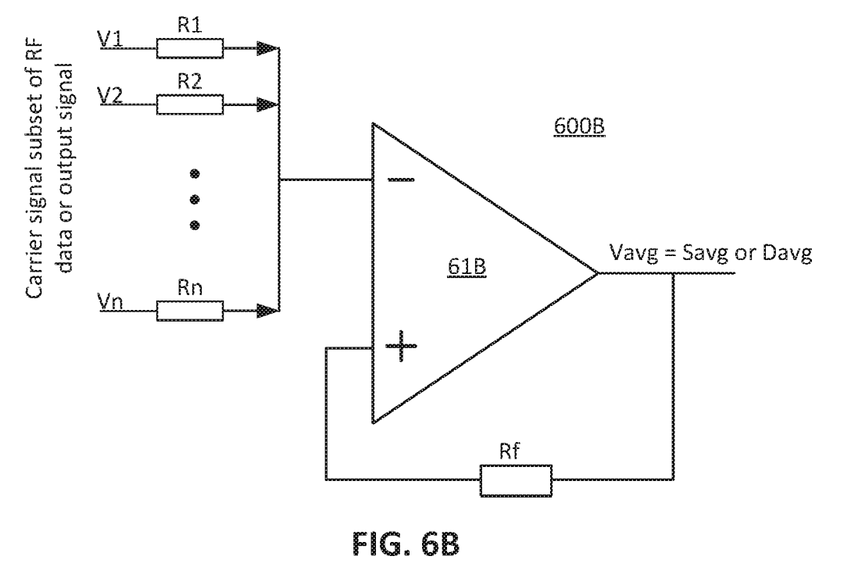
FIG. 6B is an exemplary averaging circuit according to another embodiment of the present invention.

FIG. 6B is an exemplary averaging circuit 600B according to an embodiment of the present invention. Averaging circuit 600B is similar to averaging circuit 600A of FIG. 6A with the difference that a resistor is connected between each voltage of a subset of square wave signals taken from the modulated carrier signal and the input terminal of the operational amplifier 61B. Similar to the current averaging circuit 600A, the output Vavg of voltage averaging circuit 600B with a feedback operational amplifier is obtained by applying Kirchhoff's first law to the input terminal of the operational amplifier according to the following relation:

$$V{bias}=-Rf(V1/R1+V2/R2+ \ldots +Vn/Rn)$$

where V1, V2, Vn are voltages of corresponding square wave periods of the carrier signal subset of the output signal (or RF data), R1, R2, Rn are the corresponding resistors disposed between the square wave periods of the carrier signal subset and the negative input terminal of the operational amplifier. In an embodiment, R1, R2, . . . , and Rn have substantially the same value R, so that the output voltage of averaging circuit 600B satisfies the following relation:

Vavg=−Rf/R(V1+V2+ . . . +Vn). Vavg is the Savg if the carrier signal subset is of the output signal 513. Vavg is the Davd if the carrier signal subset is of the RF data.

Figure 7:
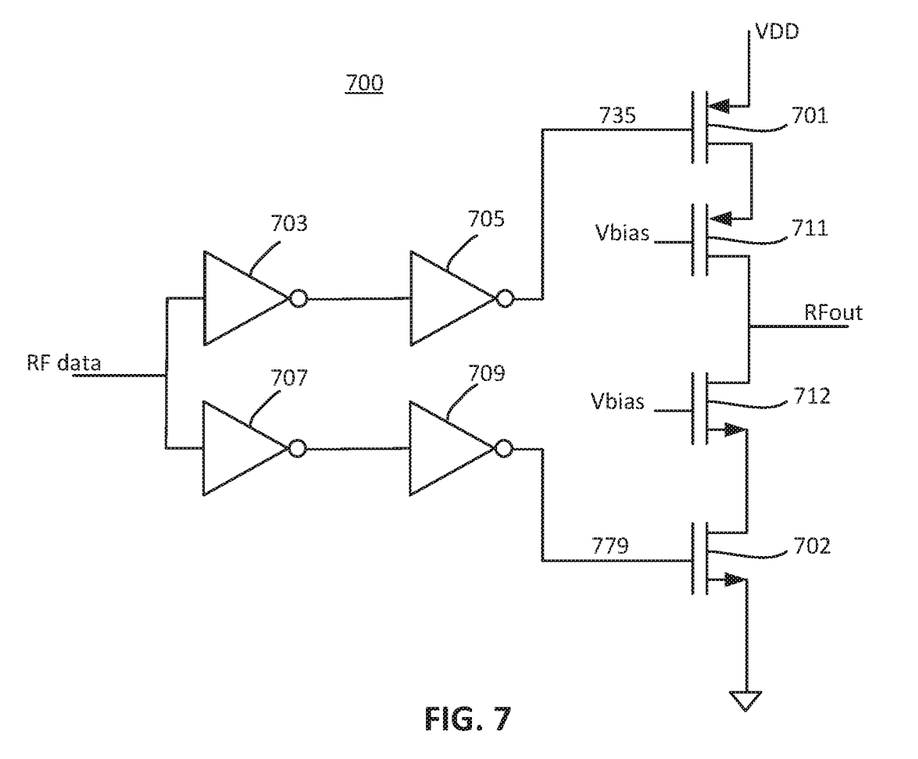
FIG. 7 is a simplified circuit diagram of a class-D amplifier having a rise and fall time adjustment circuit according to an embodiment of the present invention.

FIG. 7 is a simplified circuit diagram of a class-D amplifier 700 having a rise and fall time adjustment (balancing) circuit according to an embodiment of the present invention. Class-D amplifier 700 includes a first transistor 701 and a second transistor 702 connected in series between VDD and ground. Amplifier 700 also includes a first path having a first inverter 703 and a second inverter 705 connected in series to generate a first output signal 735 from RF data and a second path having a third inverter 707 and a fourth inverter 709 connected in series to generate a second output signal 779 from RF data. First output signal 735 and second output signal 779 have the same frequency, the same phase, and the same amplitude. In other words, first output signal 735 and second output signal 779 are substantially the same. First transistor 701 has a gate connected to signal 735 and second transistor 702 has a gate connected to signal 779. For example, signals 735 and 779 are radio frequency (RF) signal "RF data" shown in FIG. 5. It is noted that this configuration provides a better power savings than if the signal RF data is directly applied to first transistor 701 and second transistor 702 because, in this case, first and second transistors 701 and 702 have to be designed as large transistors that consume relatively more power. By having multiple inverting stages (two are used in the example), the RF data can reach rail-to-rail, so that first and second transistors 701 and 702 can be reduced in size to save power. First transistor 701 is a PMOS transistor, and second transistor 702 is an NMOS transistor. Amplifier 700 also includes a first cascode transistor 711 disposed between first transistor 701 and output RFout and a second cascode transistor 712 disposed between output RFout and second transistor 702. First and second cascade transistors 711 and 712 are configured to balance the output rise and fall times to reduce the output rise and fall times mismatch to reduce second-order harmonics.

In operation, when differential operational amplifier 603 detects Savg>Davg (Vref), the bias voltage Vbias is positive, i.e., RFout fall times>RFout rise times. The positive Vbias increases the pull-down current drive of second transistor 702 and decreases the pull-up current drive of first transistor 701 to balance the mismatch in the rise and fall times. Conversely, when differential operational amplifier 603 detects Savg<Davg (Vref), the bias voltage Vbias is negative, i.e., RFout rise times>RFout fall times. The negative Vbias increases the pull-up current drive of first transistor 701 and decreases the pull-down current drive of second transistor 702 to balance the mismatch in the rise and fall times.

Figure 8:
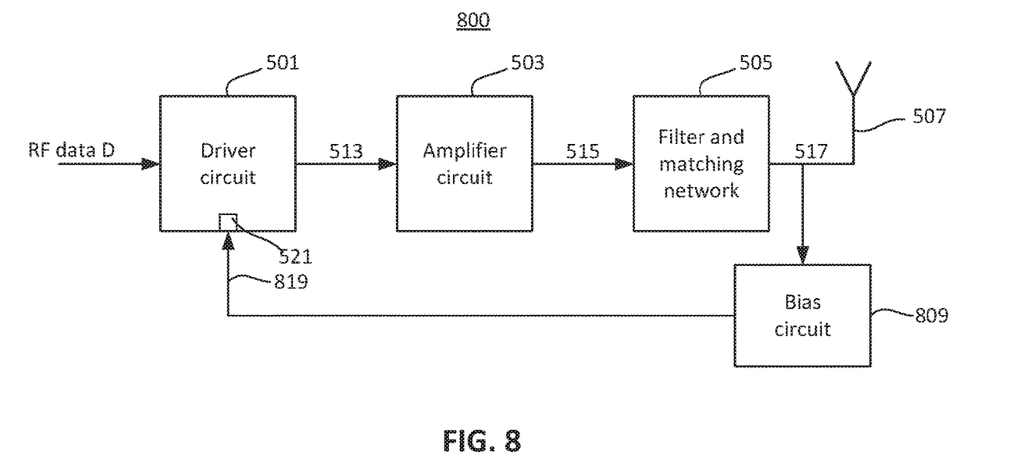
FIG. 8 is a simplified block diagram of a power amplifier circuit according to another embodiment of the present invention.

FIG. 8 is a simplified block diagram of a power amplifier circuit 800 according to another embodiment of the present invention. Referring to FIG. 8, power amplifier circuit 800 includes a driver stage circuit 501, an amplifier stage circuit 503, a filter 505, and antenna 507 coupled to an output terminal of filter 505. Power amplifier circuit 800 also includes a bias circuit 809. Driver stage circuit 501 is configured to receive a data waveform such the data stream 400 shown in FIG. 4 and provides an output signal 513. Amplifier stage circuit 503 receives signal 513 and output an amplified output signal 515 to filter 505. Filter 505 may be a low-pass filter that passes through the fundamental frequency of signal 515 to antenna 507 for transmission. In one embodiment, bias circuit 809 is a series resonant filter tuned to the second harmonic of signal 517. Bias circuit 809 may include a tunable capacitor 821 and an inductor 823 that can be tuned to the second harmonic of signal 517. Thus, bias circuit 809 can provide a bias signal Vbias 819 to driver stage circuit 501 to shape the duty cycle of output signal 513 until the second harmonic is reduced to a level below a target level.

Figure 8A:
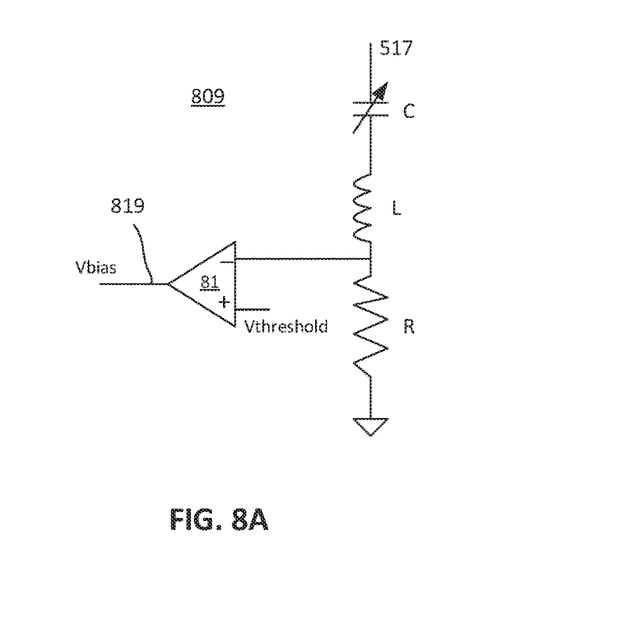
FIG. 8A is a simplified circuit diagram of a bias circuit according to another embodiment of the present invention.

FIG. 8A is a simplified circuit diagram of a bias circuit 809 according to an embodiment of the present invention. Bias circuit 809 includes a series RLC circuit comprising a capacitor C, an inductor L, and a resistor R. In one embodiment, the RLC circuit is tuned to the resonant frequency of the second harmonic. In this series configuration, XC and XL cancel each other out. Thus, the current flowing through the series resonant circuit is at a maximum value. The voltage drop at the resistor R is compared with a threshold voltage Vthreshold by a differential operational amplifier 81 that generates a bias voltage Vbias 819 if the voltage drop at the resistor R exceeds the threshold voltage value.

Figure 9:
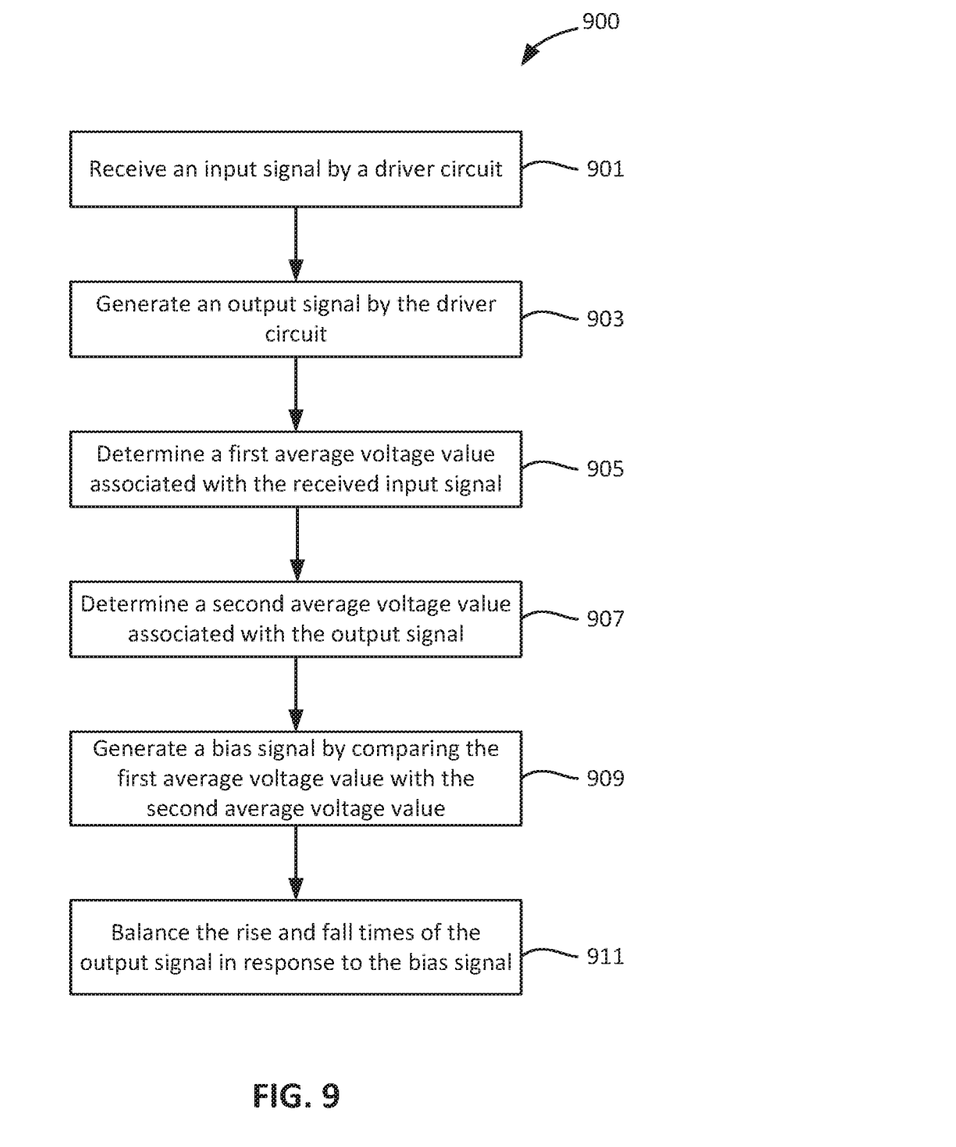
FIG. 9 is a simplified flow chart illustrating a method of operating a class-D amplifier according to exemplary embodiments of the present invention.

FIG. 9 is a simplified flow chart illustrating a method of operating a class D amplifier according to exemplary embodiments of the present invention. Referring to FIG. 9, a class-D amplifier receives a RF input signal (901) at its driver circuit. Next, at 903, the driver circuit generates an output signal that may have non-symmetrical rise and fall times that can cause harmonic distortion. Next, at 905, an average voltage value of the received RF input signal is determined by a first averaging circuit of the class-D amplifier. At 907, an average voltage value of the generated output signal is determined by a second averaging circuit of the class-D amplifier to generate a bias voltage signal. Next, at 909, the bias voltage signal is provided to the driver circuit. At 911, the driver circuit balances the rise and fall time of edges of the output signal to adjust the duty cycle of the output signal. It is to be understood that the above-described blocks may be performed in a different order. For example, the first average voltage value and the second average voltage value can be determined simultaneously or in different sequences. In other words, blocks 905 and 907 may be performed concurrently or in different sequences.

Accordingly, embodiments of the present disclosure have described a class-D amplifier and a method of operating the same in detail. In order to avoid obscuring the description of the representative embodiments, many details known in the art are not provided herein.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A power amplifier comprising:
   a driver circuit having an input for receiving a radio frequency (RF) signal, an output for outputting a digital output signal, and a bias port for receiving a bias signal; and
   a bias circuit configured to maintain a 50% duty cycle of the digital output signal and having a first input coupled to the output of the driver circuit for receiving the digital output signal, a second input coupled to the input of the driver circuit for receiving the RF signal, and an output coupled to the bias port of the driver circuit for providing the bias signal to the driver circuit, wherein the bias circuit further comprises:
   a first averaging circuit configured to determine a first average voltage value of the digital output signal;
   a second averaging circuit configured to determine a second average voltage value of the RF signal; and
   a comparator configured to generate a bias voltage signal based on a difference between the first average voltage value and the second average voltage value.

2. The power amplifier of claim 1, wherein the RF signal is a square wave having a 50% duty cycle.

3. The power amplifier of claim 1, wherein the comparator is a differential operation amplifier having a first input for receiving the digital output signal, a second input for receiving the RF signal, and an output for outputting the bias voltage signal.

4. The power amplifier of claim 1, wherein the first averaging circuit comprises a first operational amplifier having a plurality of inputs coupled to the digital output signal and configured to sum a voltage or a current associated with a carrier signal subset of the digital output signal; and the second averaging circuit comprises a second operational amplifier having a plurality of inputs coupled to the RF signal and configured to sum a voltage or a current associated with a carrier signal subset of the RF signal.

5. The power amplifier of claim 1, wherein the driver circuit further comprises:
   a first transistor having a gate coupled to the RF signal;
   a second transistor having a gate coupled to the RF signal;
   a first cascode transistor disposed between the first transistor and the output of the driver circuit and having a gate coupled to the bias signal;
   a second cascode transistor disposed between the output of the driver circuit and the second transistor and having a gate coupled to the bias signal;
   wherein the first, second transistors and the first and second cascode transistors are connected in series between a power supply voltage and ground.

6. The power amplifier of claim 5, wherein the first transistor is a PMOS transistor, the first cascode transistor is a PMOS transistor, the second transistor is an NMOS transistor, and the second cascode transistor is an NMOS transistor.

7. The power amplifier of claim 5, wherein the first cascode transistor and the second cascode transistor balance a rise time and a fall time of the digital output signal to obtain a 50% duty cycle of the digital output signal.

8. The power amplifier of claim 5, further comprising:
   a first path having a first plurality of inverters disposed between the RF signal and the gate of the first transistor;
   a second path having a second plurality of inverters disposed between the RF signal and the gate of the second transistor.

9. The power amplifier of claim 8, wherein the first plurality of inverters comprise a first pair of inverters connected in series; and the second plurality of inverters comprise a second pair of inverters connected in series.

10. A method for balancing rise and fall times of a digital output signal, the method comprising:
    receiving a radio frequency (RF) signal by a driver circuit;
    generating the digital output signal by the driver circuit;
    determining a first average voltage value associated with the received RF signal by a bias circuit;

determining a second average voltage value associated with the digital output signal;

generating a bias voltage signal by comparing the first average voltage value with the second average voltage value; and maintaining a 50% duty cycle of the digital output signal in response to the bias voltage signal.

11. The method of claim 10, wherein the RF signal is a square wave having a 50% duty cycle.

12. The method of claim 11, wherein determining the first average voltage value associated with the digital output signal comprises summing a voltage associated with a bit stream subset of the received RF signal.

13. The method of claim 10, wherein determining the first average voltage value associated with the digital output signal comprises summing a current associated with a bit stream subset of the received RF signal.

14. The method of claim 10, wherein determining the second average voltage value associated with the digital output signal comprises summing a voltage associated with a carrier signal subset of the digital output signal.

15. The method of claim 10, wherein determining the second average voltage value associated with the digital output signal comprises summing a current associated with a carrier signal subset of the digital output signal.

16. The method of claim 10, wherein maintaining the 50% duty cycle of the digital output signal comprises balancing rise and fall times of the digital output signal.

17. A power amplifier comprising:

a driver circuit having an input for receiving a radio frequency (RF) signal, an output for outputting a digital output signal, and a bias port for receiving a bias signal;

an amplifier circuit coupled to the output of the driver circuit;

a filter coupled to the amplifier circuit for outputting an RF output signal; and a bias circuit coupled to the filter and configured to provide the bias signal to the bias port of the driver circuit to maintain a 50% duty cycle of the RF output signal, wherein the bias circuit comprises an RLC circuit comprising a capacitor, an inductor and a resistor connected in series between the filter and a ground potential, the RLC circuit having an impedance tuned to a second harmonic of the RF output signal.

18. The power amplifier of claim 17, further comprising a comparator coupled to the bias circuit and configured to provide the bias signal to the driver circuit when a voltage across the resistor exceeds a threshold voltage value.

* * * * *